INTEGRATED CIRCUIT BIASING ARRANGEMENT FOR SUPPLYING $V_{be}$ BIAS VOLTAGES

Filed Nov. 29, 1965

INVENTOR.
LEOPOLD A. HARWOOD
BY
Eugene M. Whitacre
Attorney

United States Patent Office 3,430,155

Patented Feb. 25, 1969

3,430,155

INTEGRATED CIRCUIT BIASING ARRANGEMENT FOR SUPPLYING $V_{be}$ BIAS VOLTAGES

Leopold A. Harwood, Somerville, N.J., assignor to Radio Corporation of America, a corporation of Delaware Filed Nov. 29, 1965, Ser. No. 510,180

U.S. Cl. 330—22 11 Claims

Int. Cl. H03f *3/04, 3/68;* H03g *3/30*

ABSTRACT OF THE DISCLOSURE

A low output impedance bias circuit particularly useful in maintaining operating point stability of integrated circuit amplifiers in the presence of temperature and power supply variations, including a first transistor connected in a common emitter configuration and a second transistor connected in a common collector configuration. The output electrode of each transistor is connected to the input electrode of the other, and a stabilized biasing voltage is developed between the emitter electrode of the first transistor and one of the base and emitter electrodes of the second transistor.

This invention relates to electrical circuits, in general, and to biasing arrangements for integrated circuits, in particular.

As used herein, the term integrated circuit refers to a unitary or monolithic semiconductor device or chip which is the equivalent of a network of inter-connected active and passive circuit elements. Various problems have presented themselves in the design of such a semiconductor device. One problem, that of establishing and maintaining a stable operating point for integrated circuit amplifiers, is not solved by the use of techniques normally employed in discrete semiconductor amplifier circuits.

It is an object of the present invention, therefore, to provide an improved biasing circuit suitable for establishing and maintaining a stable operating point for integrated circuit amplifier configurations.

A biasing circuit embodying the invention includes at least a pair of transistors, one of which is connected in a common emitter type configuration and the other of which is connected in a common collector type configuration. The output electrode of each transistor is connected to the input electrode of the other. A stabilized biasing voltage is developed between the emitter electrode of the first transistor and one of the base and emitter electrodes of the second transistor. The resultant circuit provides a very low impedance biasing voltage source which may be used to establish and maintain the operating point of semiconductor amplifier devices at a level primarily determined by the collector load resistance of the first transistor. A biasing circuit of the type described, when incorporated as an integral portion of an integrated circuit including the amplifier to be stabilized, is effective to maintain the operating point of the amplifier substantially constant over wide variations in power supply voltage and temperature.

For a better understanding of the present invention, together with further objects thereof, reference is had to the following description, taken in connection with the accompanying drawings, and its scope will be pointed out in the appended claims.

Referring to the drawings.

Figures 1, 2, 3, 4:
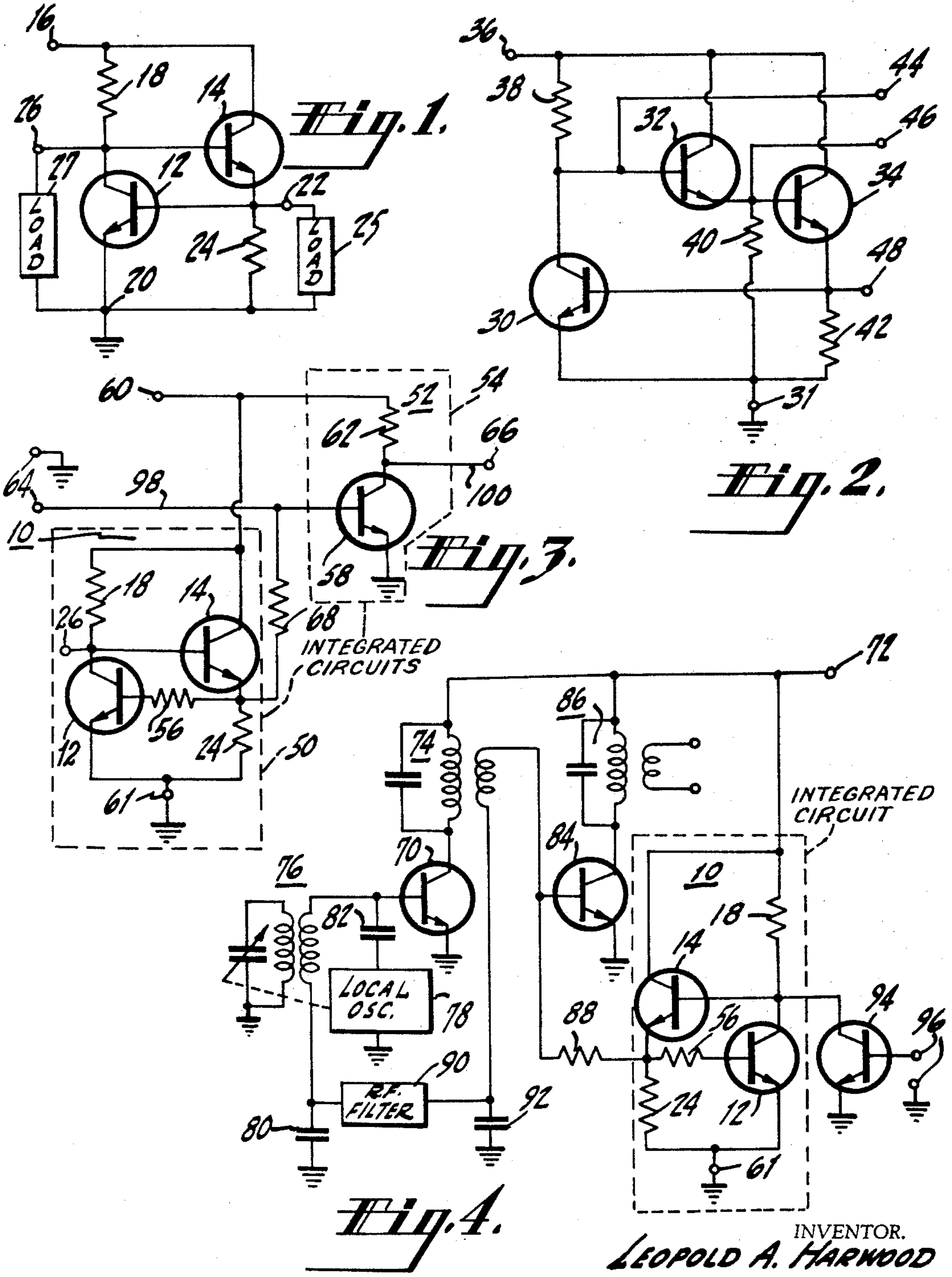
FIG. 1 shows a schematic circuit diagram of a stabilized biasing circuit constructed in accordance with the invention.
FIG. 2 shows a schematic circuit diagram of another such circuit.

FIG. 3 shows a circuit diagram of a stage of transistor amplification with biasing being provided by a circuit embodying the invention; and FIG. 4 shows a schematic diagram of a portion of a radio receiver including a converter stage, an intermediate frequency (I.F.) amplifier stage, and a stabilized biasing circuit embodying the invention, with the latter including provisions for automatic gain control.

Referring now in particular to FIG. 1, the stabilized biasing circuit there shown includes a pair of transistors 12 and 14. One transistor 12 is arranged in a common emitter type configuration, with its collector electrode connected to an energizing potential terminal 16 through a resistor 18 and with its emitter electrode connected to a reference terminal 20 which is shown at ground potential. The other transistor 14 is arranged in a common collector type configuration, with its collector electrode connected to the energizing potential terminal 16 and with its emitter electrode connected to the reference terminal 20 through a resistor 24. The emitter electrode of transistor 14 is also connected to the base electrode of transistor 12 and to a first output terminal 22. The collector electrode of transistor 12 is additionally connected to the base electrode of transistor 14 and to a second output terminal 26. Appropriate load circuits 25 and 27 are connected between the first and second output terminals 22 and 26 and reference terminal 20, respectively. Potential terminal 16 and reference terminal 20 are adapted to be connected to a source of energizing potential of proper polarity (not shown).

If the current drawn by the load 25 is sufficient to permit the proper $V_{be}$ voltage drop to develop across the base-emitter junction of transistor 14, the resistor 24 may be omitted. As used herein, the term $V_{be}$ voltage represents the average base-to-emitter voltage of a transistor which is operating as the active device in an amplifier circuit or the like. For silicon transistors, the $V_{be}$ voltage is approximately 0.7 volts, which is within the range of the proper $V_{be}$ voltage for Class A amplification.

In the operation of the stabilized biasing circuit of FIG. 1, i.e. with a proper polarity potential source connected between the terminals 16 and 20, a point of equilibrium is reached at which one $V_{be}$ voltage drops are developed across the base-emitter junctions of each of the transistors 12 and 14. The base-emitter junction of transistor 14, however, is connected in parallel with the collector-base junction of transistor 12. The quiescent voltage developed between the collector and emitter electrodes of transistor 12 therefore equals the sum of the $V_{be}$ voltage drops of transistors 12 and 14. With the emitter electrode of transistor 12 grounded via terminal 20, a potential equal to the $V_{be}$ voltage drop of transistor 12 is developed at output terminal 22 relative to ground terminal 20 while a potential equal to the sum of the $V_{be}$ voltage drops of transistors 12 and 14 is developed at output terminal 26 relative to ground terminal 20. If, on the other hand, the terminal 20 is not grounded but is at some level of voltage instead, then these output potentials would each be increased by that amount. In the discussion that follows, it will be understood that the transistors 12 and 14 are each composed of the same semiconductor material, such as is the case in monolithic silicon integrated circuits, so that their respective $V_{be}$ voltage drops are equal. Thus the potential developed at output terminals 22 and 26 equal one and two $V_{be}$ voltage drops, respectively, relative to the terminal 20.

The stabilized biasing circuit just described provides the following features. First, no capacitors are employed—thus the problems that would be created by incorporating capacitors in integrated circuit design is eliminated. Second, low values of resistance (of the order of 5,000 ohms) can be used for resistor 18 and for resistor 24

(where needed) which resistors, therefore, require only a small amount of space on an integrated circuit chip. And, third, the circuit presents a low output impedance at the terminal 22 for the load circuit 25 which is connected to it. This output impedance, between the terminals 20 and 22, is inversely proportional to the product of the gain of the common emitter stage and the transconductance of the common collector stage and, as such, is very low.

Referring now to FIG. 2, there is shown another biasing circuit embodying the invention. More particularly, FIG. 2 shows an arrangement of transistor inter-connections which illustrates how an integral number of stabilized $V_{be}$ voltage drops can be obtained and made available as biasing potentials. Three transistors 30, 32, and 34 are shown. The first transistor 30 is arranged in a common emitter type configuration, with its collector electrode connected to an energizing potential terminal 36 through a resistor 38 and with its emitter electrode connected to a reference terminal 31 which is connected to ground. The other two transistors 32 and 34 are arranged in a "cascaded" common collector type configuration, with the collector electrodes of each being connected to the energizing potential terminal 36 and with their emitter eletrodes being connected to the reference terminal 31, that of transistor 32 through a resistor 40 and that of transistor 34 through a resistor 42. These resistors 40 and 42 are chosen to permit the proper $V_{be}$ voltage drops to be developed across the base-emitter junctions of their respective transistors 32 and 34. The collector electrode of transistor 30 is also connected to the base electrode of transistor 32, the emitter electrode of transistor 32 to the base electrode of transistor 34, and the emitter electrode of transistor 34 to the base electrode of transistor 30. Output terminals 44, 46 and 48 are connected to the collector electrode of the transistor 30, the emitter electrode of the transistor 32, and the emitter electrode of the transistor 34, respectively.

In operation, i.e. with a proper polarity potential source connected between the terminals 36 and 31, a point of equilibrium is reached at which one $V_{be}$ voltage drops are developed across the base-emitter junctions of each of the transistors 30, 32 and 34. With the arrangement constructed as described, with terminal 31 grounded, and with transistors 30, 32 and 34 composed of the same semiconductor material, a potential of one $V_{be}$ voltage drop is developed at terminal 48, a potential of two $V_{be}$ voltage drops is developed at terminal 46, and a potential of three $V_{be}$ voltage drops is developed at terminal 44. By virtue of the inter-connections between the various electrodes of transistors 30, 32 and 34, these potentials will remain substantially constant, even for wide variations in the applied energizing potential. As such, these potentials are useful for biasing purposes.

It will be obvious to one skilled in the art that higher biasing potentials than three $V_{be}$ voltage drops can be obtained simply by increasing the number of cascaded common collector configurations—a four $V_{be}$ voltage drop potential can be adding a third common collector stage, a five $V_{be}$ voltage drop potential can be obtained by adding a fourth common collector stage, etc. Stabilized biasing potentials other than an integral number of $V_{be}$ voltage drops can also be obtained through the use of appropriate voltage divider networks connected to one or more of the output terminals at which the $V_{be}$ voltage drops are developed.

Referring now to FIG. 3, there is shown a common emitter transistor amplifier 52, the operating point of which is stabilized in accordance with the principles of the present invention. More particularly, the transistor amplifier 52 is stabilized by a biasing circuit 10 similar to that shown in FIG. 1. Thus, the reference numerals used to designate selected components of the FIG. 1 biasing circuit will be used, wherever practical, to designate those same components in the circuit of FIG. 3. As will be readily apparent, the biasing circuit of FIG. 3 differs from that of FIG. 1 in that it additionally includes a resistor 56 in the feedback path between the emitter electrode of transistor 14 and the base electrode of transistor 12.

Returning to the configuration of FIG. 3, the amplifier circuit 52 is shown as including a transistor 58 having its collector electrode connected to an energizing potential terminal 60 through a resistor 62 and its emitter electrode connected to ground. Signals to be amplified are applied across the input terminals 64 and are coupled via the conductor 98 to the base electrode of transistor 58. Amplified signals are developed at the collector electrode of transistor 58 and are coupled via the conductor 100 to the output terminal 66. The potential developed at the emitter electrode of the transistor 14 is applied to the base electrode of transistor 58 through an isolation resistor 68 to provide the operating bias for that transistor. The value of resistor 56 connected between the emitter electrode of transistor 14 and the base electrode of transistor 12 is so selected that the voltage drop across it is equal to the voltage drop produced across resistor 68 by the biasing current of transistor 58.

With a proper polarity potential source connected between potential terminal 60 and reference terminal 61, the operating point of the transistor 58 is established primarily by the value of the resistor 18, and this operating point is maintained substantially constant for wide variations in the applied energizing potential and temperature.

It will be understood that the biasing circuit 10 and the amplifier circuit 54 are both included in the same integrated circuit structure, such as a monolithic silicon integrated circuit made in accordance with known techniques. If desired, the biasing potential developed by the circuit 10 can be applied to several amplifiers. The low impedance presented by the biasing circuit minimizes the coupling between the various amplifiers from the common biasing supply connections.

FIG. 4, shows a portion of a radio receiver including a converter stage, and I.F. amplifier stage, and a biasing circuit embodying the invention, with the latter including provisions for automatic gain control. The converter stage includes a transistor 70 arranged in a common emitter amplifier configuration, with its collector electrode connected to an energizing potential terminal 72 through a first I.F. resonant transformer circuit 74 and with its emitter electrode connected to ground. The converter stage also includes a radio frequency (R.F.) tuning circuit 76 and a local oscillator circuit 78 which is ganged to tune with the circuit 76. Input R.F. signals are coupled to the base electrode of transistor 70 through a secondary winding of the tuning circuit 76, one end of which is grounded for signal frequencies by capacitor 80. Local oscillator signals from circuit 78 are coupled to the base electrode of transistor 70 through coupling capacitor 82 to beat with the R.F. signals and produce amplified I.F. signals at the collector electrode of transistor 70. These amplified signals are then coupled through the secondary winding of the I.F. resonant circuit 74 to the base electrode of a transistor 84, included in the I.F. stage of the FIG. 4 arrangement.

The transistor 84 is also arranged in a common emitter amplifier configuration, with its collector electrode connected to the potential terminal 72 through a second I.F. resonant transformer circuit 86 and with its emitter electrode connected to ground. The transistor 84 amplifies the I.F. signals coupled to its base electrode, the amplified signals being developed across the secondary winding of the I.F. resonant circuit 86. This winding may then be connected to a following amplifier or detector stage (not shown) for further processing of the amplified I.F. signals.

A bias potential for the converter transistor 70 and the I.F. transistor 84 is developed at the emitter electrode of the transistor 14 of the circuit 10 in the afore-described manner. This bias potential, which is in the order of one $V_{be}$ voltage drop for the particular arrangement shown, is coupled through a resistor 88 to the base electrode of the I.F. transistor 84 and, also, through the secondary winding of the I.F. resonant circuit 74, an R.F. filter 90, and the secondary winding of the R.F. tuning circuit 76 to the base electrode of the converter transistor 70. A bypass capacitor 92 is connected between the junction of the R.F. filter 90 with the secondary winding of the I.F. resonant circuit 74 and ground. The R.F. filter 90 can be a low resistance unit, such as a choke coil or ferrite bead, so the voltage drop across the unit due to the biasing current of the transistor 70 can be neglected.

Automatic gain control is provided in the circuit of FIG. 4 by varying the bias coupled to the base electrodes of the converter and I.F. transistors 70 and 84. A transistor 94 is arranged in a common emitter configuration, with its collector electrode connected to the collector electrode of transistor 12 and with its emitter electrode connected to ground. A varying D.C. signal, indicative of variations in input signal intensity and derived in any suitable manner, is applied across the terminals 96 and coupled to the base electrode of transistors 94 to control its conductivity. In the discussion that follows, it will be understood that increases in the D.C. signal applied across terminal 96 correspond to increases in signal intensity from a threshold potential for no signal conditions. Increases in the D.C. signal, furthermore, are characterized by the D.C. signal going more positive than the threshold value.

In operation, any increase in the D.C. signal applied across the terminal 96 increases the conductivity of transistor 94, increases the voltage drop across resistor 18, and decreases the voltage at the base electrode of the transistor 14. The effect of any such decrease at the base electrode of the transistor 14 is to reduce the voltage developed at its emitter electrode and, therefore, the biasing potentials coupled to the base electrodes of transistors 70 and 84. As a result, the quiescent operating currents and transconductances of transistors 70 and 84 are reduced, with a corresponding reduction in the gain provided by the converter and I.F. stages. This automatic gain control action does not affect the stability of these stages, however, which is still controlled by the biasing arrangement 10. It will be understood that the converter transistor 70 and I.F. transistor 84 may be incorporated in the same integrated circuit structure as the biasing circuit 10 including the transistor 94. It will also be understood that this automatic gain control action can be used with the amplifier configuration of FIG. 3 and can be included in the same integrated circuit structure as the arrangement there shown.

What is claimed is:

1. A biasing circuit for providing direct voltages to establish the operating point of semiconductor amplifiers comprising:
   - a plurality of transistors, each having an emitter electrode, a base electrode and a collector electrode;
   - circuit means coupled to the emitter, base and collector electrodes of a first one of said plurality of transistors for connecting said first transistor in a common emitter configuration;
   - circuit means coupled to the emitter, base and collector electrodes of a second one of said plurality of transistors for connecting said second transistor in a common collector configuration;
   - means for coupling the collector electrode of said first transistor to the base electrode of said second transistor;
   - means for coupling the emitter electrode of said second transistor to the base electrode of said first transistor; and
   - means for deriving a direct output voltage between one of the emitter and base electrodes of said second transistor and the emitter electrode of said first transistor to bias one of said semiconductor amplifiers at its desired operating point.

2. A biasing circuit for providing direct voltages to establish the operating point of semiconductor amplifiers comprising:
   - first and second transistors, each having an emitter electrode, a base electrode and a collector electrode;
   - first and second terminals adapted to be connected to a source of energizing potential;
   - a first resistor connected between the collector electrode of said first transistor and said first terminal;
   - a direct current connection from the emitter electrode of said first transistor to said second terminal;
   - a direct current connection from the collector electrode of said second transistor to said first terminal;
   - a seond resistor connected between the emitter electrode of said second transistor and said second terminal;
   - a direct current connection from the collector electrode of said first transistor to the base electrode of said second transistor;
   - a direct current connection from the emitter electrode of said second transistor to the base electrode of said first transistor; and
   - means for deriving a direct output voltage between one of the emitter and base electrodes of said second transistor and said second terminal to bias one of said semiconductor amplifiers at its desired operating point.

3. A biasing circuit for providing direct voltages to establish the operating point of semiconductor amplifiers, comprising:
   - first, second and third transistors, each having an emitter electrode, a base electrode and a collector electrode;
   - first and second terminals adapted to be connected to a source of energizing potential;
   - a first resistor connected between the collector electrode of said first transistor and said first terminal;
   - a direct connection having substantially zero impedance from the emitter electrode of said first transistor to said second terminal;
   - a direct current connection from the collector electrode of said second transistor to said first terminal;
   - a second resistor connected between the emitter electrode of said second transistor and said second terminal;
   - a direct current connection from the collector electrode of said third transistor to said first terminal;
   - a third resistor connected between the emitter electrode of said third transistor and said second terminal;
   - a direct current connection from the collector electrode of said first transistor to the base electrode of said second transistor;
   - a direct current connection between the emitter electrode of said second transistor and the base electrode of said third transistor;
   - a direct current connection between the emitter electrode of said third transistor and the base electrode of said first transistor; and
   - means for deriving a direct output voltage between one of the emitter and base electrodes of said second and said third transistors and said second terminal to bias one of said semiconductor amplifiers at its desired operating point.

4. A biasing circuit for establishing and maintaining the operating point of a semiconductor amplifier comprising:
   - first and second transistors, each having an emitter electrode, a base electrode and a collector electrode;
   - first and second terminals adapted to be connected to a source of energizing potential;
   - a first resistor connected between the collector electrode of said first transistor and said first terminal;

- a direct connection having substantially zero impedance from the emitter electrode of said first transistor to said second terminal;
- a direct connection having substantially zero impedance from the collector electrode of said second transistor to said first terminal;
- a second resistor connected at one end to the emitter electrode of said second transistor and at the other end to said second terminal;
- a direct current connection from the collector electrode of said first transistor to the base electrode of said second transistor;
- circuit means for connecting said one end of said second resistor to the base electrode of said first transistor; and
- means for deriving a direct output voltage at low impedance between the emitter electrode of said second transistor and said second terminal to bias said semiconductor amplifier at said operating point.

5. A biasing circuit as defined in claim 4 in which the operating point of said semiconductor amplifier is primarily determined by the value of said first resistor.

6. In an integrated circuit configuration of the type including an amplifier transistor having a collector electrode coupled to a first energizing potential terminal, an emitter electrode coupled to a second energizing potential terminal and a base electrode coupled to a source of input signals to be amplified, a biasing circuit for establishing and maintaining the operating point of said amplifier transistor comprising:

- first and second transistors incorporated as a part of said integrated circuit configuration, each having an emitter electrode, a base electrode and a collector electrode;
- a first resistor connected between the collector electrode of said first transistor and said first terminal;
- a direct connection having substantially zero impedance from the emitter electrode of said first transistor to said second terminal;
- a direct connection having substantially zero impedance from the collector electrode of said second transistor to said first terminal;
- a second resistor connected at one end to the emitter electrode of said second transistor and at the other end to said second terminal;
- a direct current connection from the collector electrode of said first transistor to the base electrode of said second transistor;
- circuit means connecting said one end of said second resistor to the base electrode of said first transistor for connecting the base-emitter junction of said second transistor in parallel with the collector-base junction of said first transistor;
- means for deriving a first output voltage at low impedance between the emitter electrode of said second transistor and said second energizing potential terminal;
- and means for coupling said derived output voltage to the base electrode of said amplifier transistor to bias said amplifier transistor at said operating point.

7. A biasing circuit as defined in claim 6 in which there is also included means for deriving a second output voltage at high impedance between the base electrode of said second transistor and said second energizing potential terminal and at a voltage value substantially equal to twice the voltage value of said first output voltage.

8. A biasing circuit as defined in claim 6 in which there is also included a third resistor connected between the emitter electrode of said second transistor and the base electrode of said amplifier transistor for isolating said input signal source from said output voltage deriving means and for coupling said derived output voltage to said amplifier transistor to bias said transistor at said operating point.

9. A biasing circuit as defined in claim 8 in which said circuit means includes a fourth resistor connected between the emitter electrode of said second transistor and the base electrode of said first transistor for establishing a voltage drop in said circuit means equal to the voltage drop developed across said isolating resistor by the biasing currents of said amplifier transistor.

10. A biasing circuit as defined in claim 9 in which there is additionally included means for applying an automatic gain control signal to the collector electrode of said first transistor for controlling the voltage value of said first output voltage and of the bias voltage coupled to the base electrode of said amplifier transistor.

11. An integrated circuit including a single semiconductor body having formed thereon:

- first, second, third and fourth transistors, each having an emitter electrode, a base electrode and a collector electrode;
- first and second terminals adapted to be connected to a source of energizing potential;
- a first resistor connected between the collector electrode of said first transistor and said first terminal;
- a direct current connection from the emitter electrode of said first transistor to said second terminal;
- a direct current connection from the base electrode of said first transistor to a source of input signals to be amplified;
- a second resistor connected between the collector electrode of said second transistor and said first terminal;
- a direct current connection from the emitter electrode of said second transistor to said second terminal;
- a direct current connection from the collector electrode of said third transistor to said first terminal;
- a third resistor connected between the emitter electrode of said third transistor and said second terminal;
- a fourth resistor connected between the emitter electrode of said third transistor and the base electrode of said first transistor;
- a direct current connection from the collector electrode of said second transistor to the base electrode of said third transistor;
- a fifth resistor connected between the emitter electrode of said third transistor and the base electrode of said second transistor;
- a direct current connection from the collector electrode of said fourth transistor to the collector electrode of said second transistor;
- a direct current connection from the emitter electrode of said fourth transistor to said second terminal; and
- a direct current connection from the base electrode of said fourth transistor to a source of D.C. signals indicative of the intensity level of said input signals to be amplified.

References Cited

UNITED STATES PATENTS

| | | | |
|---|---|---|---|
| 2,979,666 | 4/1961 | Erath | 330—25 X |
| 3,025,472 | 4/1962 | Greatbatch | 330—25 X |
| 3,259,833 | 7/1966 | Barter | 323—22 X |
| 3,259,835 | 7/1966 | McPherson | 323—22 |
| 3,287,653 | 11/1966 | Goordman | 330—25 X |

JOHN KOMINSKI, *Primary Examiner.*

JAMES B. MULLINS, *Assistant Examiner.*

330—29, 38, 40